(12) United States Patent
Kokubun et al.

(10) Patent No.: US 7,982,431 B2
(45) Date of Patent: Jul. 19, 2011

(54) DETECTION CIRCUIT

(75) Inventors: Masatoshi Kokubun, Kasugai (JP);
Takashi Matsumoto, Kasugai (JP);
Hidenobu Ito, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 426 days.

(21) Appl. No.: 12/031,403

(22) Filed: Feb. 14, 2008

(65) Prior Publication Data
US 2008/0252265 A1   Oct. 16, 2008

(30) Foreign Application Priority Data

Feb. 16, 2007   (JP) ................................. 2007-036535

(51) Int. Cl.
*H02J 7/00* (2006.01)
*H02J 7/04* (2006.01)
*H02J 7/16* (2006.01)

(52) U.S. Cl. ........ 320/128; 320/137; 320/139; 320/141; 320/152

(58) Field of Classification Search .................. 320/139, 320/141, 128
See application file for complete search history.

(56) References Cited

U.S. PATENT DOCUMENTS

| 5,808,444 A * | 9/1998 | Saeki et al. ................... 320/117 |
| 6,246,215 B1 * | 6/2001 | Popescu-Stanesti .......... 320/139 |
| 7,626,371 B2 * | 12/2009 | Hoshino et al. ............... 323/283 |

FOREIGN PATENT DOCUMENTS
JP   2002-078228   3/2002
* cited by examiner

*Primary Examiner* — Edward Tso
*Assistant Examiner* — Ahmed Omar
(74) *Attorney, Agent, or Firm* — Fujitsu Patent Center

(57) ABSTRACT

A detection circuit that reduces circuit scale. A plurality of current amplifiers respectively generate a plurality of detection signals corresponding to current flowing to a plurality of resistors. An error amplifier coupled to the plurality of current amplifiers compares the plurality of detection signals with a plurality of reference signals, respectively, to generate an error signal based on the comparison.

8 Claims, 6 Drawing Sheets

DETECTION CIRCUIT

CROSS-REFERENCE TO RELATED APPLICATIONS

This application is based upon and claims the benefit of priority from the prior Japanese Patent Application No. 2007-036535, filed on Feb. 16, 2007, the entire contents of which are incorporated herein by reference.

BACKGROUND OF THE INVENTION

This application invention relates to a detection circuit, and more specifically, to a detection circuit incorporated in a power supply system.

A portable electronic device such as a notebook computer is normally operated by a battery, which is installed in the electronic device, or an external power supply, such as an AC adapter. The battery, or rechargeable battery, is charged by a charging circuit incorporated in the electronic device. Japanese Patent No. 3428955 discloses a charging circuit for charging a rechargeable battery with charging current supplied from an external power supply. The operation of the conventional charging circuit will now be described with reference to FIG. 1.

A charging circuit 11 is incorporated in an electronic device. DC adapter voltage VAC is supplied to the charging circuit 11 from an input power adapter 12 coupled to the electronic device. The charging circuit 11 is a DC/DC converter that generates output voltage $V_{out}$ from the adapter voltage VAC. The charging circuit 11 controls the output voltage $V_{out}$ based on a detection value of an output current $I_{out}$ or the like. More specifically, the charging circuit 11 includes current amplifiers 13a and 13b. The current amplifier 13a is coupled to the two ends of a resistor R1 to detect the output current $I_{out}$. The current amplifier 13b is coupled to the two ends of a resistor R2 to detecting charging current $I_{chg}$, which is supplied to a battery BT. The current amplifiers 13a and 13b are respectively coupled to error amplifiers 14a and 14b. Terminal voltage of the battery BT is supplied to an error amplifier 14c, and the voltage between the terminals of the resistor R1 is supplied to a multiplier 15. The multiplier 15 is coupled to an error amplifier 14d. The error amplifiers 14a to 14d generate a control current $I_{SC}$ based on the output current $I_{out}$ flowing to the resistor R1, the charging current $I_{chg}$ flowing to the resistor R2, and the terminal voltage of the battery BT. A pulse width modulator (PWM) 17 varies a duty cycle for activating and inactivating MOS transistors T1 and T2 based on the control current $I_{SC}$. The power output from the charging circuit 11 is adjusted in accordance with the varied duty cycle. The battery BT is charged by the charging current $I_{chg}$ when the output power of the charging circuit 11 is supplied to a system circuit 19 via a system DC/DC converter 18.

Portable electronic devices have become compact. This has resulted in a demand for reduction in the scale of the charging circuit. However, in the prior art, to control the output voltage $V_{out}$, a charging circuit requires one error amplifier for each detection subject. In the charging circuit 11 of FIG. 1, four error amplifiers 14a to 14d are required for the four detection subjects (i.e., output current $I_{out}$, charging current $I_{chg}$, terminal voltage of the battery BT, and voltage between the terminals of the resistor R1). This increases the scale of the detection circuit. Furthermore, an electronic component used for phase correction at the output terminal of each error amplifier must be externally attached to the chip of the charging circuit 11. Thus, if the number of error amplifiers increases, the number of external terminals of the chip increases. This inhibits reduction of the chip scale.

SUMMARY OF THE INVENTION

According to an aspect of one embodiment, a detection circuit and a power supply system that enables circuit scale reduction are provided.

One aspect of the embodiment is a detection circuit for detecting current flowing to a plurality of resistors. The detection circuit includes a plurality of current amplifiers, respectively coupled to the plurality of resistors, which generate a plurality of detection signals corresponding to the current flowing to the plurality of resistors, wherein each of the plurality of current amplifiers generates a corresponding one of the plurality of detection signals in accordance with the current flowing to a corresponding one of the plurality of resistors. An error amplifier, coupled to the plurality of current amplifiers, compares the plurality of detection signals with a plurality of reference signals, each associated with the corresponding one of the plurality of detection signals, and generates an error signal based on the comparison.

A further aspect of the embodiment is a detection circuit for incorporation in an electronic device for detecting input current supplied to the electronic device and charging current supplied to a rechargeable battery coupled to the electronic device. The detection circuit includes a first current amplifier which detects the input current and generates a first detection signal. A second current amplifier detects the charging current and generates a second detection signal. An error amplifier generates an error signal based on the first detection signal, the second detection signal, and a comparison reference signal. The comparison reference signal is set based on a first reference signal corresponding to the input current and a second reference signal corresponding to the charging current. The error amplifier generates the error signal in accordance with the difference between the comparison reference signal and one of the first and second detection signals.

Another aspect of the embodiment is a detection circuit for detecting a first current flowing to a first resistor and a second current flowing to a second resistor, which is coupled to the first resistor. The detection circuit includes a first current amplifier, coupled to the first resistor, which generates a first detection signal corresponding to the first current flowing to the first resistor. A second current amplifier, coupled to the second resistor, generates a second detection signal corresponding to the second current flowing to the second resistor. A subtractor receives a first reference signal, which corresponds to the first current, and a second reference signal, which corresponds to the second current, and generates first and second computation signals indicating a relative level difference of the first and second reference signals. A computing unit, coupled to the subtractor and operably coupled to the first current amplifier, generates a third computation signal with the first detection signal and the first and second computation signals. An error amplifier, coupled to the computing unit and the second current amplifier, generates an error signal in accordance with the difference between one of the first and second reference signals and one of the third computation signal and second detection signal.

Still another aspect of the embodiment is a power supply system including an external power supply which generates a first output voltage for a direct current and varies the first output voltage in accordance with a control current. An electronic device is connectable to the external power supply and a rechargeable battery which generates a second output voltage. The rechargeable battery is chargeable by a charging current supplied from the external power supply. The electronic device includes a system circuit operated by at least one of the first output voltage generated by the external power supply and the second output voltage generated by the rechargeable battery. A detection circuit detects the first output voltage, a first output current corresponding to the first output voltage, the second output voltage, and the charging current. The detection circuit includes an error amplifier which generates an error signal in accordance with the difference between a comparison reference signal and at least two of the first output voltage, the first output current, the second output voltage, and the charging current. The detection circuit further includes a current control circuit which generates the control current based on the error signal.

A further aspect of the embodiment is a power supply system including an external power supply which generates a first output voltage for a direct current and varies the first output voltage in accordance with a control current. An electronic device is connectable to the external power supply and a rechargeable battery which generates a second output voltage. The rechargeable battery is chargeable by a charging current supplied from the external power supply. The electronic device includes a system circuit operated by at least one of the first output voltage generated by the external power supply and the second output voltage generated by the rechargeable battery. A detection circuit generates the control current. A first resistor enables the flow of a first output current corresponding to the first output voltage. A second resistor, coupled between the first resistor and the rechargeable battery, enables the flow of the charging current supplied to the secondary current. The detection circuit includes a first current amplifier which generates a first detection signal corresponding to the first output current flowing to the first resistor. A second current amplifier generates a second detection signal corresponding to the charging current flowing to the second resistor. A subtracter receives a first reference signal, which corresponds to the first output current, and a second reference signal, which corresponds to the second current, and generates first and second computation signals indicating a relative level difference of the first and second reference signals. A computing unit, coupled to the subtracter and operably coupled to the first current amplifier, generates a third computation signal with the first detection signal and the first and second computation signals. An error amplifier, coupled to the computing unit and the second current amplifier, generates an error signal in accordance with the difference between one of the first and second reference signals and one of the third computation signal and second detection signal. A current control circuit generates the control current based on the error signal.

Other aspects and advantages of the embodiment will become apparent from the following description, taken in conjunction with the accompanying drawings, illustrating by way of example the principles of the invention.

BRIEF DESCRIPTION OF THE DRAWINGS

The embodiments, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
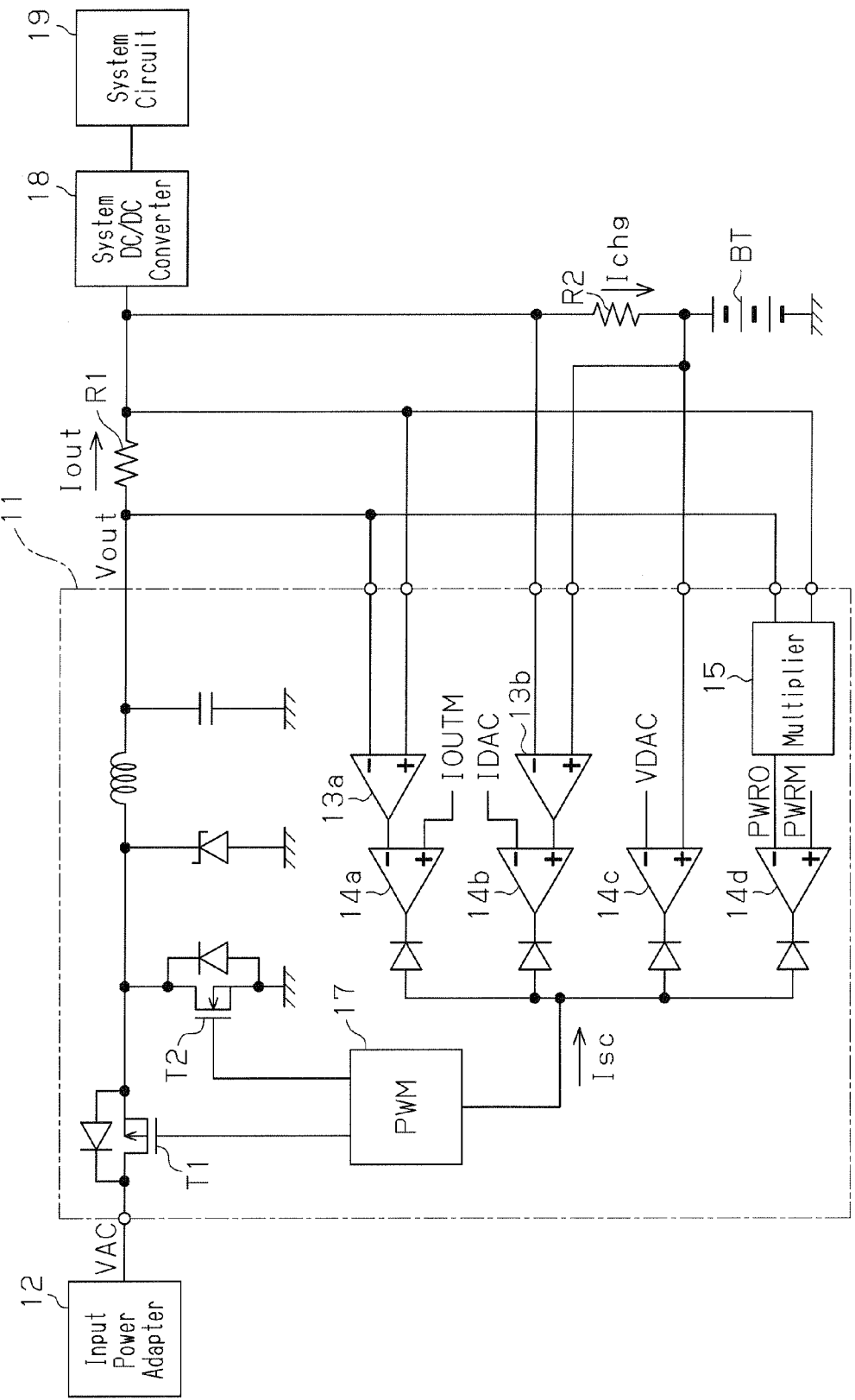
FIG. 1 is a schematic circuit diagram of a conventional power supply system.

In the drawings, like numerals are used for like elements throughout.

A power supply system according to a preferred embodiment of the present invention will now be discussed with reference to FIGS. 2 to 6.

Figure 2:
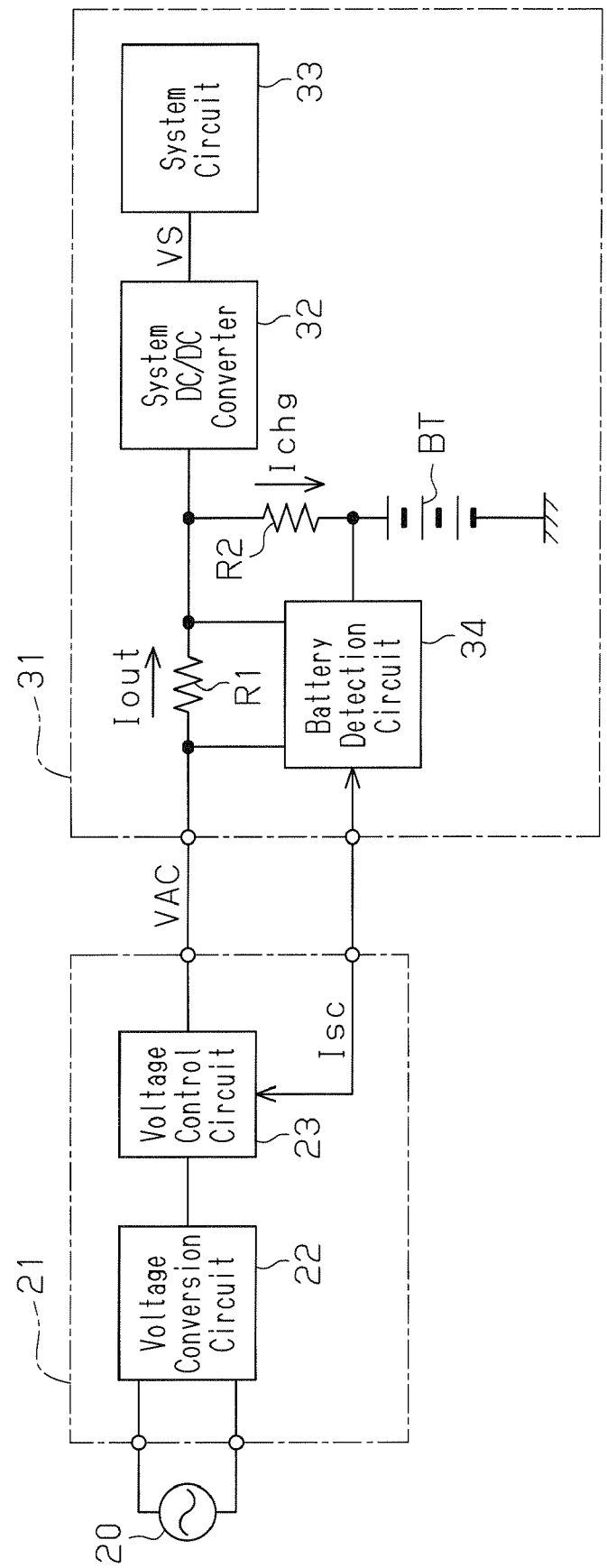
FIG. 2 is a schematic block diagram of a power supply system according to a preferred embodiment.

FIG. 2 is a schematic block diagram of the power supply system. The power supply system includes an AC adapter 21 serving as an external power supply, and an electronic device 31 coupled to the AC adapter 21. The AC adapter 21 is connected to an AC power supply 20. Commercial AC voltage is supplied from the AC power supply 20 to a voltage conversion circuit 22 of the AC adapter 21. The voltage conversion circuit 22 converts the AC voltage to DC voltage and supplies the DC voltage to a voltage control circuit 23. The voltage control circuit 23 generates adapter voltage VAC from the DC voltage in response to a control current $I_{SC}$ supplied from the electronic device 31. The adapter voltage VAC is supplied to the electronic device 31.

The adapter voltage VAC is supplied to a system DC/DC converter 32 via a resistor R1. A rechargeable battery (battery) BT is coupled to the system DC/DC converter 32 via a resistor R2. The system DC/DC converter 32 generates system voltage VS from the input voltage based on the adapter voltage VAC and the battery voltage supplied from the battery BT. The system voltage VS is supplied to a system circuit 33. That is, the system circuit 33 is supplied with at least one of the power from the AC adapter 21 and the power from the battery BT. The system circuit 33 is a circuit for providing various functions of the electronic device 31.

A battery detection circuit 34 is coupled to the two terminals of the resistor R1 and to a node between the resistor R2 and the battery BT. The battery detection circuit 34 detects current $I_{out}$ flowing to the resistor R1 based on the potential difference between the terminals of the resistor R1. The battery detection circuit 34 also detects current $I_{chg}$ flowing to the resistor R2 based on the potential difference between the terminals of the resistor R2. The battery detection circuit 34 further detects the voltage (or adapter voltage VAC), which is supplied to the system DC/DC converter 32, and the terminal voltage of the battery BT. The battery detection circuit 34 generates the control current $I_{SC}$ based on the detected currents and voltages. The control current $I_{SC}$ is supplied to the voltage control circuit 23 of the AC adapter 21. The voltage control circuit 23 of the AC adapter 21 then controls the adapter voltage VAC in accordance with the control current $I_{SC}$ output from the battery detection circuit 34.

The configuration of an example of the AC adapter 21 will now be described.

Figure 3:
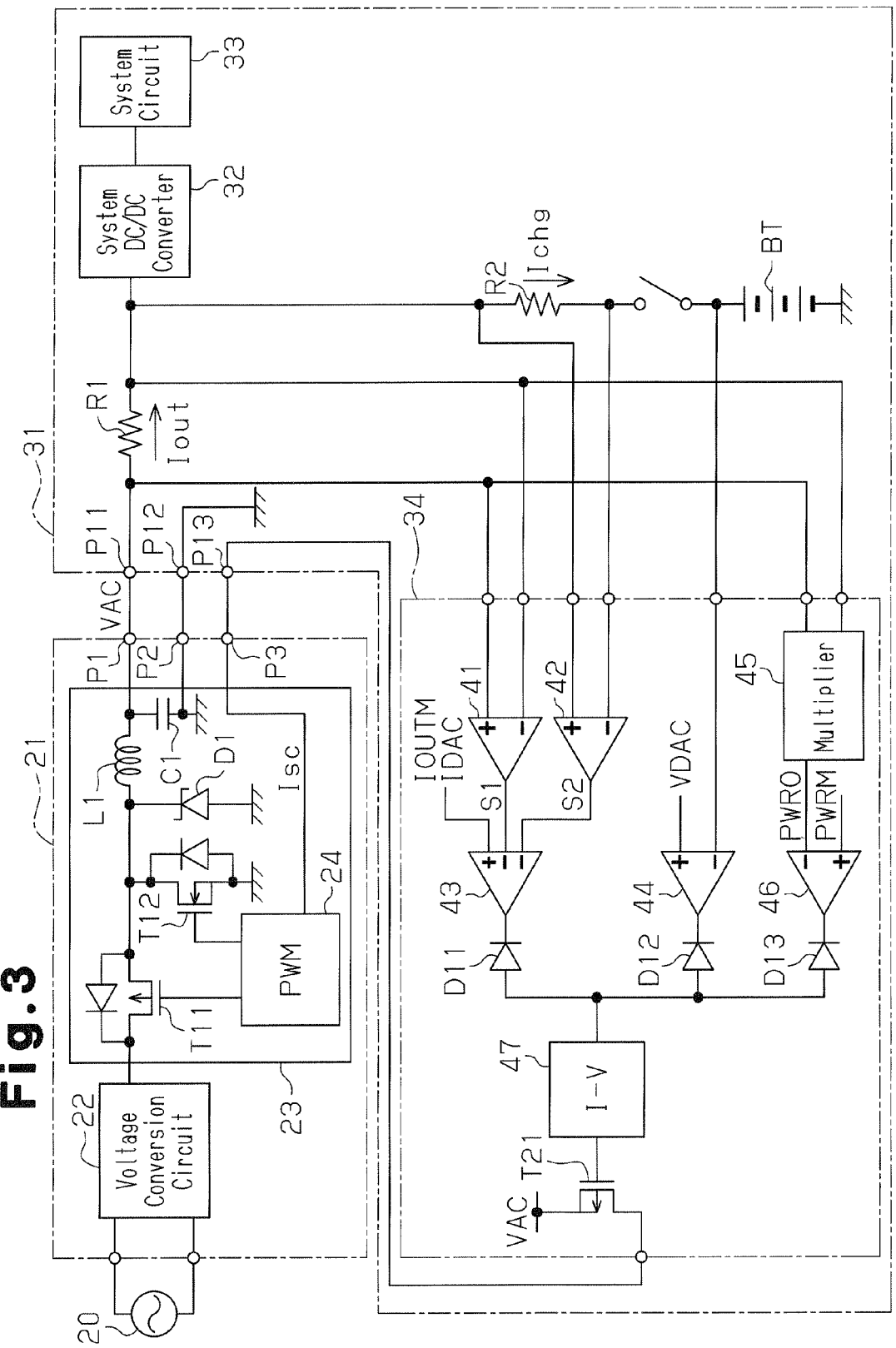
FIG. 3 is a schematic circuit diagram of the power supply system shown in FIG. 2.

As shown in FIG. 3, the voltage conversion circuit 22 has an output terminal coupled to a first terminal (e.g., source) of a first transistor T11. A second terminal (e.g., drain) of the first transistor T11 is coupled to a first terminal of a choke coil L1. A second terminal of the choke coil L1 is coupled to a first terminal P1 of the AC adapter 21. The second terminal of the first transistor T11 is also coupled to a first terminal (e.g., drain) of a second transistor T12. A second terminal (e.g., source) of the second transistor T12 is coupled to ground. A control terminal (gate) of the first transistor T11 and a control terminal (gate) of the second transistor T12 are coupled to a pulse width modulator (PWM) 24. In the preferred embodiment, the first transistor T11 is a P-channel MOS transistor, and the second transistor T12 is an N-channel MOS transistor. As shown in FIG. 3, the transistors T11 and T12 each have a body diode.

The first terminal of the choke coil L1 is coupled to the cathode of a diode D1, and the anode of the diode D1 is coupled to ground. The first terminal P1 of the AC adapter 21 is coupled to a first terminal of a capacitor C1, and a second terminal of the capacitor C1 is coupled to ground. A second terminal P2 of the AC adapter 21 is coupled to ground, and a third terminal P3 of the AC adapter 21 is coupled to the PWM 24. The choke coil C1 and the capacitor C1 form a smoothing circuit.

The control current $I_{SC}$ is supplied to the PWM 24 from the battery detection circuit 34 via the third terminal P3. The PWM 24 activates and inactivates the first transistor T11 and the second transistor T12 in a complementary manner in accordance with a predetermined duty cycle. The output current of the transistor T11 is controlled by the switching operation of the first transistor T11, and the output current is smoothed by a smoothing circuit (L1 and C1). When the first transistor T11 is activated, the output voltage of the voltage conversion circuit 22 is supplied to the smoothing circuit (L1 and C1) via the transistor T11. When the first transistor T11 is inactivated, a current path extending through the choke coil L1 and the diode D1 is formed. Further, the energy stored in the choke coil L1 is discharged to the first terminal P1.

The PWM 24 changes the duty cycle in response to the control current $I_{SC}$. More specifically, the PWM 24 varies the period during which the first transistor T11 is activated in accordance with the current value of the control current $I_{SC}$. The AC adapter 21 generates the adapter voltage VAC, which corresponds to the activated period of the first transistor T11. If the activated period of the first transistor T11 is long, the energy stored in the choke coil L1 increases. This raises the adapter voltage VAC. If the activated period of the first transistor T11 is short, the energy stored in the choke coil L1 decreases. This lowers the adapter voltage VAC.

The AC adapter 21 changes the adapter voltage VAC in accordance with the control current $I_{SC}$. When the control current $I_{SC}$ is not supplied to the AC adapter 21, the AC adapter 21 generates the adapter voltage VAC with minimum voltage. In this case, the control current $I_{SC}$ is 0 (zero) when the AC adapter 21 coupled to the AC power supply 20 is coupled to the electronic device 31. Thus, the adapter voltage VAC having a minimum voltage is supplied to the electronic device 31. Thus, a large inrush current is prevented from flowing to the battery BT in the electronic device 31.

The configuration of the battery detection circuit 34 in the electronic device 31 will now be described.

The adapter voltage VAC generated by the AC adapter 21 is supplied to the DC/DC converter 32 via the resistor R1, which is coupled to a first terminal P11 of the electronic device 31.

The current $I_{out}$ supplied from the AC adapter 21 flows to the resistor R1. The current $I_{out}$ corresponds to an input current $I_{in}$ of the electronic device 31. The adapter voltage VAC is further supplied to the battery BT via the resistor R1 and the resistor R2. The charging current $I_{chg}$ supplied to the battery BT flows to the resistor R2.

The battery detection circuit 34 includes two current amplifiers 41 and 42. The two terminals of the resistor R1 are coupled to two input terminals of a current amplifier 41, and the two terminals of the resistor R2 are coupled to two input terminals of a current amplifier 42. The current amplifier 41 detects the current $I_{out}$ flowing to the resistor R1, that is, the output current from the AC adapter 21 and provides an output current detection signal S1 (first detection signal), which corresponds to the detection value of the output current $I_{out}$, to an error amplifier 43. The current amplifier 42 detects the current $I_{chg}$ flowing to the resistor R2, that is, the charging current $I_{chg}$ to the battery BT and provides a charging current detection signal S2 (second detection signal) corresponding to the detection value of the charging current $I_{chg}$ to the error amplifier 43.

The error amplifier 43 includes a first inversion input terminal for receiving the detection signal S1, a second inversion input terminal for receiving the detection signal S2, and a non-inversion input terminal. A comparison reference signal generated from a reference current signal IOUTM (first reference signal) and a current limiting signal IDAC (second reference signal) is provided to the non-inversion input terminal of the error amplifier 43. The reference current signal IOUTM is set to the voltage value corresponding to the total current amount (i.e., input current $I_{in}$ ($I_{out}$ in FIG. 3)) used in the electronic device 31. The current limiting signal IDAC is set to the voltage value corresponding to the charging current of the battery BT. The error amplifier 43 compares the one of the detection signal S1 and the detection signal S2 having a lower signal level with the comparison reference signal to generate an error voltage (error signal) corresponding to the comparison result. In principle, the error amplifier 43 compares the first and second detection signals S1 and S2 with the first and second reference signals IOUTM and IDAC respectively corresponding to the first and second detection signals S1 and S2 to generate the error signal based on the comparison result.

A node between the resistor R2 and the battery BT is coupled to an inversion input terminal of an error amplifier 44. A voltage limiting signal $V_{DAC}$ is provided to a non-inversion input terminal of the error amplifier 44. The error amplifier 44 generates an error voltage by amplifying the difference between the terminal voltage of the battery BT and the voltage limiting signal $V_{DAC}$.

The two terminals of the resistor R1 are coupled to a multiplier 45. The multiplier 45 detects the adapter voltage VAC based on the terminal voltage of the resistor R1 and obtains the total current amount of the electronic device 31 based on the voltage between the terminals of the resistor R1. The multiplier 45 obtains the total power amount by multiplying the adapter voltage VAC and the total current amount and provides a power detection signal PWRO, which corresponds to the total power amount, to an error amplifier 46. The error amplifier 46 includes an inversion input terminal, which receives the power detection signal PWRO, and a non-inversion input terminal, which receives a power limiting signal PWRM. The error amplifier 46 generates an error voltage by amplifying the difference between the power detection signal PWRO and the power limiting signal PWRM.

When comparing the battery detection circuit 34 of the preferred embodiment with the conventional charging circuit 11 (see FIG. 1), the conventional charging circuit 11 requires four error amplifiers 14a to 14d for the four detection subjects. However, the battery detection circuit 34 of the preferred embodiment uses only the three error amplifiers 43, 44, and 46 for the four detection subjects (i.e., output current $I_{out}$, charging current $I_{chg}$, terminal voltage of the battery BT, and voltage between the terminals of the resistor R1), which are the same detection subjects as those of the conventional charging circuit 11. Specifically, the battery detection circuit 34 generates the error voltage corresponding to the current $I_{out}$ flowing to the resistor R1 and the error voltage corresponding to the charging current $I_{chg}$ of the battery BT using one error amplifier 43, whereas the two error amplifiers 14a, 14b are required to perform the same process in the conventional charging circuit 11. This decreases the number of components required to be externally attached to the chip. That is, the number of external terminals is decreased. Accordingly, the scale of the chip may be reduced, and the size of the package sealing the chip may be reduced.

The cathodes of diodes D11, D12, and D13 are respectively coupled to the output terminals of the error amplifiers 43, 44, and 46. The anodes of the diodes D11 to D13, which are coupled together, and coupled to a current-voltage conversion circuit 47. The diodes D11 to D13 transmit the current (error current) corresponding to the largest one of the error voltages output from the error amplifiers 43, 44, and 46 to the current-voltage conversion circuit 47. In other words, the largest error detection value of the four error detection values is provided to the current-voltage conversion circuit 47.

A control terminal (gate) of a transistor T21, which forms a constant current source (current control circuit), is coupled to the output terminal of the current-voltage conversion circuit 47. The current-voltage conversion circuit 47 provides the gate of the transistor T21 with a signal indicating a voltage value that is proportional to the current amount. The transistor T21 is a P-channel MOS transistor in the preferred embodiment. The adapter voltage VAC is supplied to the source of the transistor T21. The drain of the transistor T21 is coupled to a third terminal P13 of the electronic device 31. A second terminal P12 of the electronic device 31 is coupled to ground.

The transistor T21 operates as a resistor having a resistance value, which corresponds to the gate voltage, and generates the control current $I_{SC}$, which corresponds to the resistance value. Specifically, the transistor T21, which is formed by a P-channel MOS transistor, has a large resistance value when the gate voltage is high and a small resistance value when the gate voltage is low. Therefore, an increase in the output voltage of the current-voltage conversion circuit 47, or the error detection value provided to the current-voltage conversion circuit 47, decreases the control current $I_{SC}$. Further, a decrease in the output voltage of the current-voltage conversion circuit 47, or the error detection value, increases the control current $I_{SC}$.

When the battery BT is not coupled to the electronic device 31, the battery terminal voltage supplied to the error amplifier 44 is 0 (zero). The charging current detected by the error amplifier 43 is also 0. In this case, the error detection value, that is, the input current supplied to the current-voltage conversion circuit 47 is large, and the control current $I_{SC}$ flowing from the transistor T21 is small. Therefore, the voltage control circuit 23 of the AC adapter 21 outputs a low adapter voltage VAC. In this state, if the battery BT is coupled to the electronic device 31, the difference between the terminal voltage of the battery BT and the adapter voltage VAC supplied from the AC adapter 21 is small. This suppresses the flow of inrush current to the battery BT.

In the above-described power supply system, the battery detection circuit 34 operates to reduce the control current $I_{SC}$ when the operation power supply voltage decreases such as when the electronic device 31 stops operating. The AC adapter 21 then generates a low adapter voltage VAC. This produces a margin for the power supply voltage that operates the battery detection circuit 34 and moderates the operating conditions. Furthermore, since the AC adapter 21 supplies low adapter voltage VAC to the electronic device 31, high adapter voltage VAC is not supplied to the electronic device 31 during the low voltage operation of the electronic device 31. This prevents the circuits in the electronic device 31 from being damaged.

The error amplifier 43 will now be described in detail.

Figure 4:
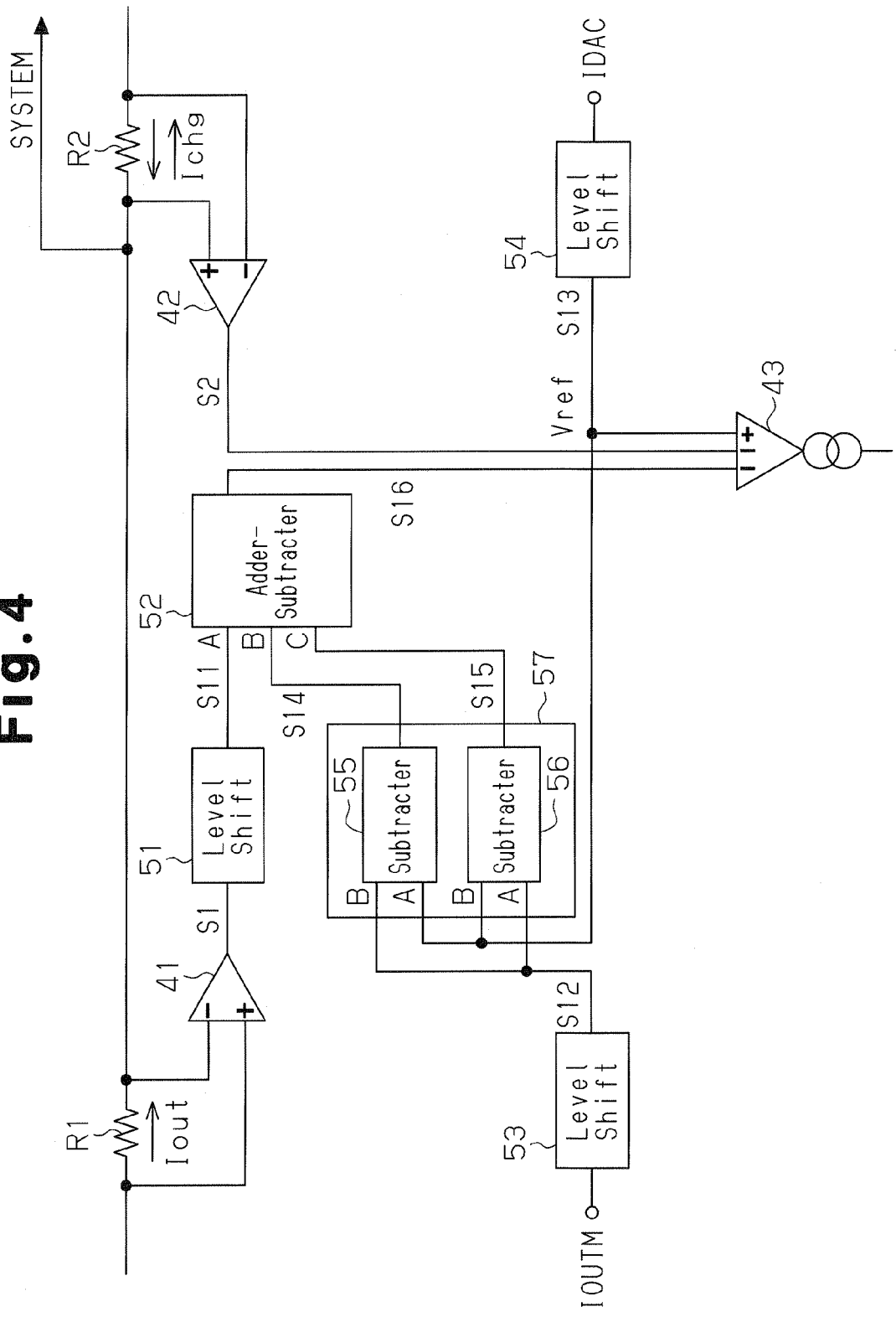
FIG. 4 is a schematic block diagram of a battery detection circuit shown in FIG. 3.

FIG. 3 illustrates the principle operation of the error amplifier 43. In the actual circuit, as shown in FIG. 4, a plurality of circuits are required at the input stage of the error amplifier 43. However, the input stage circuits shown in FIG. 4 do not increase the number of external terminals of the chip. The input stage circuits operate so that the error amplifier 43 generates the error voltage using the reference current signal IOUTM (first reference signal), the current limiting signal IDAC (second reference signal), the output current detection signal S1 (first detection signal), and the charging current detection signal S2 (second detection signal). The input stage circuits are necessary when simply replacing the conventional error amplifiers 14a and 14b with the error amplifier 43 of the preferred embodiment.

Specifically, the detection signal S1 generated by the current amplifier 41 is provided to a level shift circuit 51. The level shift circuit 51 converts the detection signal S1 to a first conversion signal S11 having a level corresponding to the fluctuation range of the detection signal S2, which is generated by the current amplifier 42. The signal S11 is provided to an adder-subtractor 52. In the same manner, a level shift circuit 53 converts the reference current signal IOUTM to a second conversion signal S12 having a level corresponding to the fluctuation range of the detection signal S2, and a level shift circuit 54 converts the current limiting signal IDAC to a third conversion signal-D13 having a level corresponding to the fluctuation range of the detection signal S2.

A subtractor 57 includes first and second subtractors 55 and 56. The signal S13 generated by the level shift circuit 54 is provided to an input terminal A of the first subtractor 55, and the signal S12 generated by the level shift circuit 53 is provided to an input terminal B of the first subtractor 55. The signal S12 generated by the level shift circuit 53 is provided to an input terminal A of the second subtracter 56, and the signal S13 generated by the level shift circuit 54 is provided to an input terminal B of the second subtracter 56.

The subtracters 55 and 56 subtract the level of the signal provided to the input terminal B from the level of the signal provided to the input terminal A to generate first and second computation signals S14 and S15, respectively. The first and second computation signals S14 and S15 relatively indicate the level difference of the two signals S12 and S13. The signals S12 and S13 are input to the subtracters 55 and 56 in an intersecting manner. The signal S12 is provided to the input terminal A of the subtracter 56 and the input terminal B of the subtracter 55. The signal S13 is provided to the input terminal A of the subtracter 55 and the input terminal B of the subtracter 56. Therefore, the signals S14 and S15 have the same absolute value but are of opposite signs.

The adder-subtractor 52 has an input terminal A for receiving the signal S11 from the level shift circuit 51, an input terminal B for receiving the signal S14 from the subtracter 55, and an input terminal C for receiving the signal S15 from the subtracter 56. In the preferred embodiment, the adder-subtractor 52 adds the level of the signal S14, which is provided to the input terminal B, to the level of the signal S11, which is provided to the input terminal A. The adder-subtractor 52 further subtracts the level of the signal S15, which is provided to the input terminal C, from the above sum to generate a third computation signal S16. That is, the third computation signal S16 has a computed value of (A+B−C).

The output signal S16 of the adder-subtractor 52 is provided to the first inversion input terminal of the error amplifier 43. The signal S2 generated by the current amplifier 42 is provided to the second inversion input terminal of the error amplifier 43. The signal S13 generated by the level shift circuit 54 is provided to the non-inversion input terminal of the error amplifier 43 as a comparison reference signal Vref. The error amplifier 43 compares the one of the signals S2 and S16 having the lower signal level with the comparison reference signal Vref and generates an error voltage corresponding to the comparison result.

Figure 5:
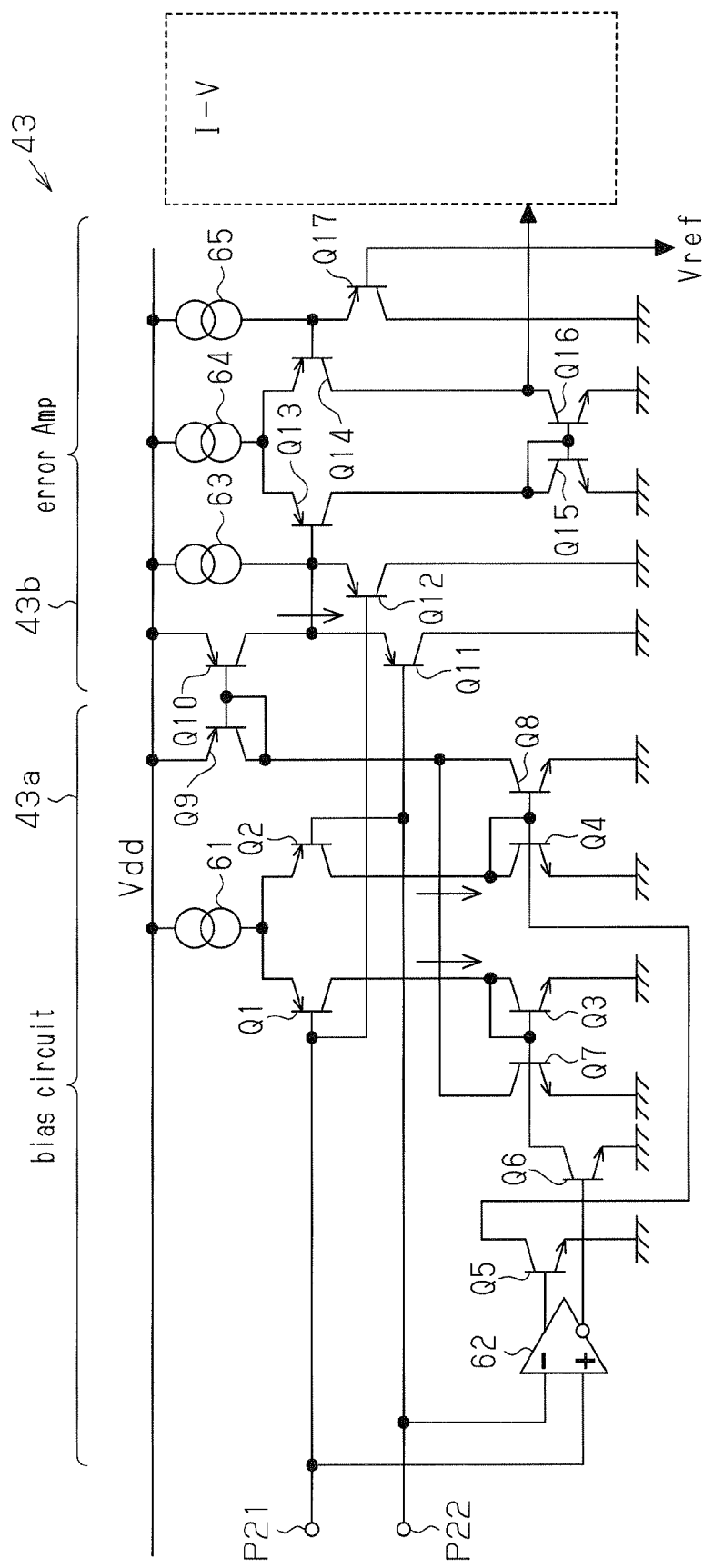
FIG. 5 is a schematic circuit diagram of an example of an error amplifier shown in FIGS. 3 and 4.

FIG. 5 is a schematic circuit diagram of the error amplifier 43 of FIGS. 3 and 4. The error amplifier 43 includes a bias circuit 43a and an error amplifier circuit 43b. The bias circuit 43a prevents erroneous operations that would be caused by an offset voltage in the error amplifier 43. That is, the signals provided to inversion input terminals P21 and P22 of the error amplifier 43 contain the offset voltage. In order to prevent erroneous operations that would be caused by the offset voltage, the bias circuit 43a corrects the signal provided to each inversion input terminal of the error amplifier circuit 43b (i.e., signal provided to each of the terminal P21 and P22) based on two input signals provided to the two inversion input terminals P21 and P22. The error amplifier circuit 43b generates a signal corresponding to the difference between the one of the signals provided to the two inversion input terminals having the lower voltage level and the comparison reference signal Vref.

The inversion input terminals P21 and P22 are respectively coupled to the bases of a pair of PNP transistors Q1 and Q2, which configure a differential amplifier of the bias circuit 43a. The emitters of the transistors Q1 and Q2 are coupled to each other and to a high potential power supply Vdd via a constant current source 61. The collectors of the transistors Q1 and Q2 are respectively coupled to the collectors of NPN transistors Q3 and Q4. The emitters of the transistors Q3 and Q4 are coupled to the ground.

The inversion input terminals P21 and P22 are coupled to a non-inversion input terminal and an inversion input terminal of a differential amplifier circuit 62, respectively. The output signal of the differential amplifier circuit 62 is provided to the base of an NPN transistor Q5, and the inverted output signal of the differential amplifier circuit 62 is provided to the base of an NPN transistor Q6. The emitters of the transistors Q5 and Q6 are coupled to the ground. The collector of the transistor Q5 is coupled to the base of a transistor Q4, and the collector of the transistor Q6 is coupled to the base of a transistor Q3.

The base of the transistor Q3 is coupled to the collector of the transistor Q3 and to the base of an NPN transistor Q7. The emitter of the transistor Q7 is coupled to ground, and the collector of the transistor Q7 is coupled to the collector of an NPN transistor Q8.

The base of the transistor Q4 is coupled to the collector of the transistor Q4 and to the base of the transistor Q8. The emitter of the transistor Q8 is coupled to ground, and the collector of the transistor Q8 is coupled to the collector of a PNP transistor Q9.

The base of the transistor Q9 is coupled to the collector of the transistor Q9 and to the base of a PNP transistor Q10. The emitters of the transistors Q9 and Q10 are coupled to the high potential power supply Vdd.

A constant current source 63 is coupled in parallel to the transistor Q10. The collector of the transistor Q10 is coupled to the emitters of PNP transistors Q11 and Q12 and to the base of a PNP transistor Q13. The base of the transistor Q11 is coupled to the inversion input terminal P22, and the base of the transistor Q12 is coupled to the inversion input terminal P21. The collectors of the transistors Q11, Q12 are coupled to ground.

The emitter of the transistor Q13 is coupled to the emitter of a PNP transistor Q14, and a node between the transistors Q13 and Q14 is coupled to a constant current source 64. The transistors Q13, Q14 form a differential amplifier in the error amplifier circuit 43b. The collectors of the transistors Q13 and Q14 are coupled to the collectors of NPN transistors Q15 and Q16, respectively. The NPN transistors Q15 and Q16 form a current mirror. The emitters of the transistors Q15 and Q16 are coupled to ground. The base of the transistor Q15 is coupled to the collector of the transistor Q15 and to the base of the transistor Q16. The error voltage of the error amplifier 43 is output from the collector of the transistor Q16.

The base of the transistor Q14 is coupled to a constant current source 65 and to the emitter of a PNP transistor Q17. The comparison reference signal Vref is provided to the base of the transistor Q17, and the collector of the transistor Q17 is coupled to ground.

Figure 6A:
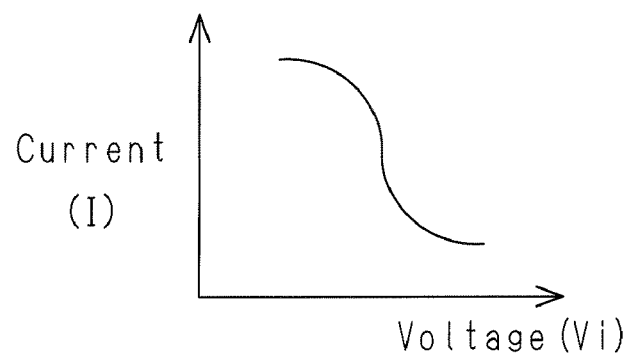
FIG. 6A is a schematic graph illustrating changes in the output current relative to the input voltage in one of the transistors of a differential pair in a bias circuit shown in FIG. 5.
Figure 6B:
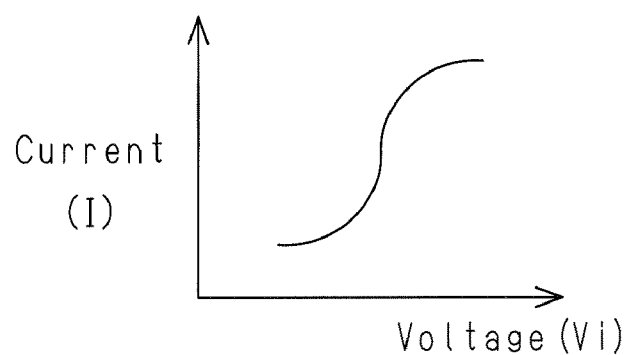
FIG. 6B is a schematic graph illustrating changes in the output current relative to the input voltage in the other one of the transistors of the differential pair in the bias circuit shown in FIG. 5.

In the bias circuit 43a, the collector current of the transistor Q1 and the collector current of the transistor Q2 vary in a complementary manner in accordance with the voltages of the signals provided to the inversion input terminals P21 and P22. FIG. 6A shows changes in the collector current of the transistor Q1 relative to the voltage supplied to the first inversion input terminal P21, and FIG. 6B shows changes in the collector current of the transistor Q2 relative to the voltage supplied to the second inversion input terminal P22.

The transistors Q3 and Q7 configure a current mirror. That is, current equal to the current flowing to the transistor Q3 (collector current of transistor Q1) flows to the transistor Q7. In the same manner, the transistors Q4 and Q8 configure a current mirror. That is, current equal to the current flowing to transistor Q4 (collector current of transistor Q2) flows to the transistor Q8.

The transistors Q5 and Q6 each operate as a switch and are activated and inactivated in a complementary manner in accordance with the level of the signal provided to each of the inversion input terminals P21 and P22. For instance, when the transistor Q5 is activated and the transistor Q6 is inactivated, the transistor Q5 connects the bases of the transistors Q4 and Q8 to ground. As a result, current equal to the current flowing to the transistor Q7, that is, the collector current of the transistor Q1, flows to the transistor Q9. Similarly, when the transistor Q6 is activated and the transistor Q5 is inactivated, current equal to the current flowing to the transistor Q8, that is, the collector current of the transistor Q2, flows to the transistor Q9.

Figure 6C:
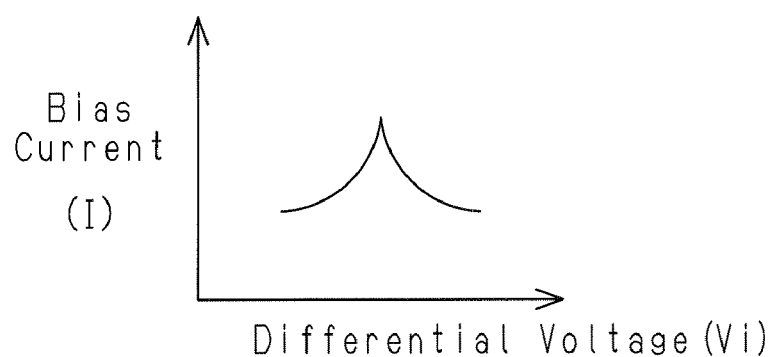
FIG. 6C is a schematic graph illustrating a bias current for cancelling offset voltage in the error amplifier shown in FIG. 5.

The transistor Q9 and the transistor Q10 configure a current mirror. That is, current equal to the current flowing to the transistor Q9 flows to the transistor Q10. As a result, bias current corresponding to an offset voltage of the signal provided to each of the terminals P21 and P22 flows to the collector of the transistor Q10 with respect to the differential voltage between the terminals P21 and P22, as shown in FIG. 6C. The bias current is added to the current flowing from the constant current source 63 to the transistors Q11 and Q12. This cancels the offset voltage of the error amplifier 43.

The power supply system of the preferred embodiment has the advantages described below.

(1) The battery detection circuit 34 generates the error voltage corresponding to the current $I_{out}$ flowing to the resistor R1 and the error voltage corresponding to the charging current $I_{chg}$ of the battery Bt with one error amplifier 43. The error amplifier 43 compares the one of the output current detection signal S1 and the charging current detection signal S2 having the lower signal level with the comparison reference signal generated from the reference current signal IOUTM and the current limiting signal IDAC to generate an error voltage corresponding to the comparison result. This decreases the number of error amplifiers in comparison with the conventional circuit and reduces the number of components externally attached to the chip. That is, the number of external terminals is reduced. Thus, the scale of the chip and size of the package sealing the chip is reduced.

(2) The error amplifier 43 corrects the current at the differential input of the error amplifier circuit 43b based on the two input signals provided to the bias circuit 43a. This prevents erroneous operations caused by offset voltage in the error amplifier 43.

(3) The AC adapter 21 varies the adapter voltage VAC in accordance with the control current $I_{SC}$ supplied from the battery detection circuit 34. When the control current $I_{SC}$ is not supplied to the AC adapter 21, the AC adapter 21 generates the adapter voltage VAC with minimum voltage. In this case, the control current $I_{SC}$ is 0 (zero) when the AC adapter 21 coupled to the AC power supply 20 is coupled to the electronic device 31. Thus, the adapter voltage VAC of minimum voltage is supplied to the electronic device 31. This prevents a large inrush current from flowing to the battery BT of the electronic device 31.

(4) When the battery BT is not coupled to the electronic device 31, the battery terminal voltage supplied to the error amplifier 44 and the charging current detected by the error amplifier 43 are both 0. In this case, the input current to the current-voltage conversion circuit 47 is large, and the control current $I_{SC}$ flowing from the transistor T21 is small. Therefore, the voltage control circuit 23 of the AC adapter 21 outputs a low adapter voltage VAC. In this state, if the battery BT is coupled to the electronic device 31, the difference between the terminal voltage of the battery BT and the adapter voltage VAC supplied from the AC adapter 21 is small. This suppresses the flow of inrush current to the battery BT.

(5) The battery detection circuit 34 operates to reduce the control current $I_{SC}$ if the operation power supply voltage decreases, such as when the electronic device 31 stops operating. The AC adapter 21 then generates a low adapter voltage VAC. This provides a margin for the power supply voltage that operates the battery detection circuit 34 and moderates the operating conditions. Furthermore, since the AC adapter 21 supplies low adapter VAC to the electronic device 31, high adapter voltage VAC will not be supplied to the electronic device 31 during the low voltage operation of the electronic device 31. This prevents the circuits in the electronic device 31 from being damaged.

It should be apparent to those skilled in the art that the present invention may be embodied in many other specific forms without departing from the spirit or scope of the invention. Particularly, it should be understood that the present invention may be embodied in the following forms.

In the preferred embodiment, the battery detection circuit may include an error amplifier for comparing three or more input signals and the comparison reference signal. In this case, inversion or non-inversion at the input terminals of the error amplifier is set as required.

In the preferred embodiment, the control current $I_{SC}$ is supplied to the AC adapter 21 from the battery detection circuit 34 of the electronic device 31, and the voltage control circuit 23 of the AC adapter 21 sets the adapter voltage VAC to a minimum voltage upon the control current $I_{SC}$ being 0 (zero). Such process may be implemented by the battery detection circuit. In this case, the control current $I_{SC}$ may be supplied from the AC adapter to the battery detection circuit.

In the preferred embodiment, the battery detection circuit 34 shown in FIG. 3 does not necessarily have to detect the voltage between the terminals of the resistor R1 (i.e., output voltage). In other words, the multiplier 45, the error amplifier 46, and the diode D13 may be omitted from the battery detection circuit 34.

In the preferred embodiment, the adapter voltage VAC does not need to be a voltage proportional to the control current $I_{SC}$. The relationship between the control current $I_{SC}$ and the adapter voltage VAC may be changed as required.

In the preferred embodiment, the output voltage of the current-voltage conversion circuit 47 may be used as the control signal instead of the control current $I_{SC}$.

The circuit configuration of the AC adapter and the electronic device is not limited to that of the preferred embodiment. The power supply system may be a semiconductor integrated circuit device in which the PWM 24, an element group controlled by the PWM 24, and the battery detection circuit 34 are integrated on a single chip in the same manner as the conventional charging circuit 11 (FIG. 1).

The present examples and embodiments are to be considered as illustrative and not restrictive, and the invention is not to be limited to the details given herein, but may be modified within the scope and equivalence of the appended claims.

What is claimed is:

1. A detection circuit for detecting current flowing to a plurality of resistors, the detection circuit comprising:
   a plurality of current amplifiers, respectively coupled to the plurality of resistors, which generate a plurality of detection signals, wherein each of the plurality of current amplifiers generates a corresponding one of the plurality of detection signals in accordance with the current flowing to a corresponding one of the plurality of resistors; and
   an error amplifier, coupled to the plurality of current amplifiers, which compares the plurality of detection signals with a plurality of reference signals, each associated with the corresponding one of the plurality of detection signals, and generates an error signal according to the current flowing to the plurality of resistors based on the comparison.

2. The detection circuit according to claim 1, wherein the error amplifier includes:
   a first input terminal which receives a comparison reference signal;
   a plurality of second input terminals which receive the plurality of detection signals generated by the plurality of current amplifiers, the comparison reference signal being set based on the plurality of reference signals, and the plurality of detection signals having different offsets;
   a bias circuit, coupled to the first input terminal and the plurality of second input terminals, which generates bias current corresponding to the offsets of the plurality of detection signals; and
   an error amplifier circuit, coupled to the bias circuit, the first input terminal, and the plurality of second input terminals, which generates the error signal in accordance with the difference between the comparison reference signal and the one of the plurality of detection signals having a lower signal level, wherein the error amplifier circuit corrects the offsets of the plurality of detection signals with the bias current.

3. The detection circuit according to claim 2, wherein the error amplifier circuit further includes:
   a differential amplifier which includes first and second transistors;
   a plurality of third transistors coupled to the first transistor and respectively responsive to the plurality of detection signals;
   a fourth transistor coupled to the second transistor and responsive to the comparison reference signal; and
   a fifth transistor which transmits the bias current generated by the bias current to the plurality of third transistors.

4. A detection circuit for detecting input current and charging current supplied to a rechargeable battery based on the input current, the detection circuit comprising:
   a first current amplifier which detects the input current and generates a first detection signal;
   a second current amplifier which detects the charging current and generates a second detection signal; and
   an error amplifier which generates an error signal based on the first detection signal, the second detection signal, and a comparison reference signal, the comparison reference signal being set based on a first reference signal corresponding to the input current and a second reference signal corresponding to the charging current, wherein the error amplifier generates the error signal in accordance with the difference between the comparison reference signal and one of the first and second detection signals.

5. The detection circuit according to claim 4, wherein the error amplifier includes:
   a first input terminal which receives the comparison reference signal;
   a second input terminal which receives the first detection signal generated by the first current amplifier;
   a third input terminal which receives the second detection signal generated by the second current amplifier, with the first and second detection signals having different offsets;
   a bias circuit, coupled to the first to third input terminals, which generates bias current corresponding to the offsets of the first and second detection signals; and
   an error amplifier circuit, coupled to the bias circuit and the first to third input terminals, which generates the error signal in accordance with the difference between the comparison reference signal and the one of the first and second detection signals having a lower signal level, wherein the error amplifier circuit corrects the offsets of the first and second detection signals with the bias current.

6. The detection circuit according to claim 5, wherein the error amplifier circuit includes:
   a differential amplifier which includes first and second transistors;
   a third transistor coupled to the first transistor and responsive to the first detection signal;
   a fourth transistor coupled to the first transistor and responsive to the second detection signal;
   a fifth transistor coupled to the second transistor and responsive to the comparison reference signal; and
   a sixth transistor which transmits the bias current generated by the bias current to the third and the fourth transistors.

7. A power supply system comprising:
   an external power supply which generates a first output voltage for a direct current and varies the first output voltage in accordance with a control current; and
   an electronic device connectable to the external power supply and a rechargeable battery which generates a second output voltage, wherein the rechargeable battery is chargeable by a charging current supplied from the external power supply, the electronic device including:
      a system circuit operated by at least one of the first output voltage generated by the external power supply and the second output voltage generated by the rechargeable battery; and
      a detection circuit which detects the first output voltage, a first output current corresponding to the first output voltage, the second output voltage, and the charging current, the detection circuit including:
         an error amplifier which generates an error signal in accordance with the difference between a comparison reference signal and at least two of the first output voltage, the first output current, the second output voltage, and the charging current; and
         a current control circuit which generates the control current based on the error signal.

8. The power supply system according to claim 7, wherein:
   the detection circuit further includes a first current amplifier which generates a first detection signal corresponding to the first output current, and a second current amplifier which generates a second detection signal corresponding to the charging current; and
   the error amplifier includes:
      a first input terminal which receives the comparison reference signal;
      a second input terminal which receives the first detection signal;
      a third input terminal which receives the second detection signal, the first and second detection signals having different offsets;
      a bias circuit, coupled to the first to third input terminals, which generates a bias current corresponding to the offsets of the first and second detection signals; and
      an error amplifier circuit, coupled to the bias circuit and the first to third input terminals, which generates the error signal in accordance with the difference between the comparison reference signal and the one of the first and second detection signals having a lower signal level, the error amplifier circuit correcting the offsets of the first and second detection signals with the bias current.

* * * * *